(12) United States Patent
Harrington et al.

(10) Patent No.: US 9,341,658 B2
(45) Date of Patent: May 17, 2016

(54) FAST ON-CHIP OSCILLATOR TRIMMING

(71) Applicant: Texas Instruments Incorporated, Dallas, TX (US)

(72) Inventors: Cormac Harrington, Cork (IE); David A. Grant, Manchester, NH (US); Andrew Alleman, Cary, NC (US); Ken Moushegian, Cary, NC (US); Hagen Wegner, Cork (IE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 129 days.

(21) Appl. No.: 14/193,898

(22) Filed: Feb. 28, 2014

(65) Prior Publication Data

US 2015/0249453 A1 Sep. 3, 2015

(51) Int. Cl.
*H03L 7/00* (2006.01)
*G01R 23/02* (2006.01)

(52) U.S. Cl.
CPC ................................ *G01R 23/02* (2013.01)

(58) Field of Classification Search
CPC ........................................................ H03L 7/00
USPC ............................................. 331/2, 44, 46, 47
See application file for complete search history.

(56) References Cited

U.S. PATENT DOCUMENTS

| 6,650,189 | B1 | 11/2003 | Romano |
| 6,711,082 | B1* | 3/2004 | Loffler ................. G11C 11/406 365/222 |
| 7,619,484 | B2* | 11/2009 | McCoy ..................... G06F 1/04 331/18 |
| 7,994,866 | B2 | 8/2011 | Fievet et al. |
| 8,058,893 | B1 | 11/2011 | Clark |
| 2013/0169369 | A1* | 7/2013 | Turner ............... H03K 3/02315 331/25 |

* cited by examiner

*Primary Examiner* — Jeffrey Shin
(74) *Attorney, Agent, or Firm* — William B. Kempler; Frank D. Cimino

(57) ABSTRACT

Oscillation frequency measurements for trimming oscillators on an integrated circuit device are performed entirely on the device. The oscillation frequency measurements utilize a reference clock. Some measurements count periods of the oscillator signal independently of the reference clock, and some measurements count periods of the reference clock independently of the oscillator signal. After one oscillator on the device has been trimmed, that trimmed oscillator may then be used to make oscillation frequency measurements for trimming another oscillator on the device.

15 Claims, 2 Drawing Sheets

FAST ON-CHIP OSCILLATOR TRIMMING

FIELD

The present work relates generally to trimming oscillators and, more particularly, to trimming oscillators entirely on the integrated circuit (IC) that contains them.

BACKGROUND

Integrated circuit devices containing one or more embedded oscillators are ubiquitous in the art. Such embedded on-chip oscillators often require trimming. For example, the oscillation frequency of an oscillator may vary from one device to another within a given production lot due to variations in manufacturing conditions (e.g., process, voltage and temperature (PVT) variations). The trimming is performed to ensure, within practical limitations, that the oscillators on all devices of a particular lot exhibit the same oscillation frequency (also referred to herein as oscillator frequency). Conventional approaches to the oscillator trimming process usually consume relatively large amounts of time during production testing, as explained in more detail below.

In conventional oscillator trimming techniques, automated test equipment ("ATE" or a "tester") external to the device under test (DUT) first configures the DUT so that the oscillator output signal is provided at an externally accessible terminal of the DUT. Then, the tester loads, successively into a trim register on the DUT, each one of a set of trim values that are to be tested. The oscillation frequency, that is, the frequency of the oscillator output signal, depends on the trim value in the trim register. The tester may use linear sweep searching, successive approximation searching, or a combination of both, to select the trim values to be tested.

For each trim value loaded into the trim register, the tester measures the corresponding oscillation frequency of the oscillator via the aforementioned externally accessible terminal of the DUT. Depending on the range of oscillation frequencies that may be expected from the oscillator, and depending on the frequency measurement capability of the tester, the oscillation frequency being measured may need to be divided down, either internally on the DUT or on a tester board that interfaces with the tester. Based on the frequency measurements taken for the corresponding trim values loaded, the tester identifies the trim value that sets the oscillator frequency closest to a target value.

The aforementioned frequency measurements can be rather time intensive, especially if the oscillator signal is noisy, such that each measurement needs to be averaged over multiple periods of the oscillator, or averaged over a period of time. The test time problem is further compounded if: the set of trim values to be tested is large; and/or there are multiple oscillators to be trimmed; and/or the transfer characteristic (input trim value versus output frequency) of one or more oscillators is not monotonic, and thus requires the tester to use a more complex trim algorithm that takes even more time to execute.

It is desirable in view of the foregoing to provide for reducing the time required to trim on-chip oscillators.

DETAILED DESCRIPTION

Figure 1:
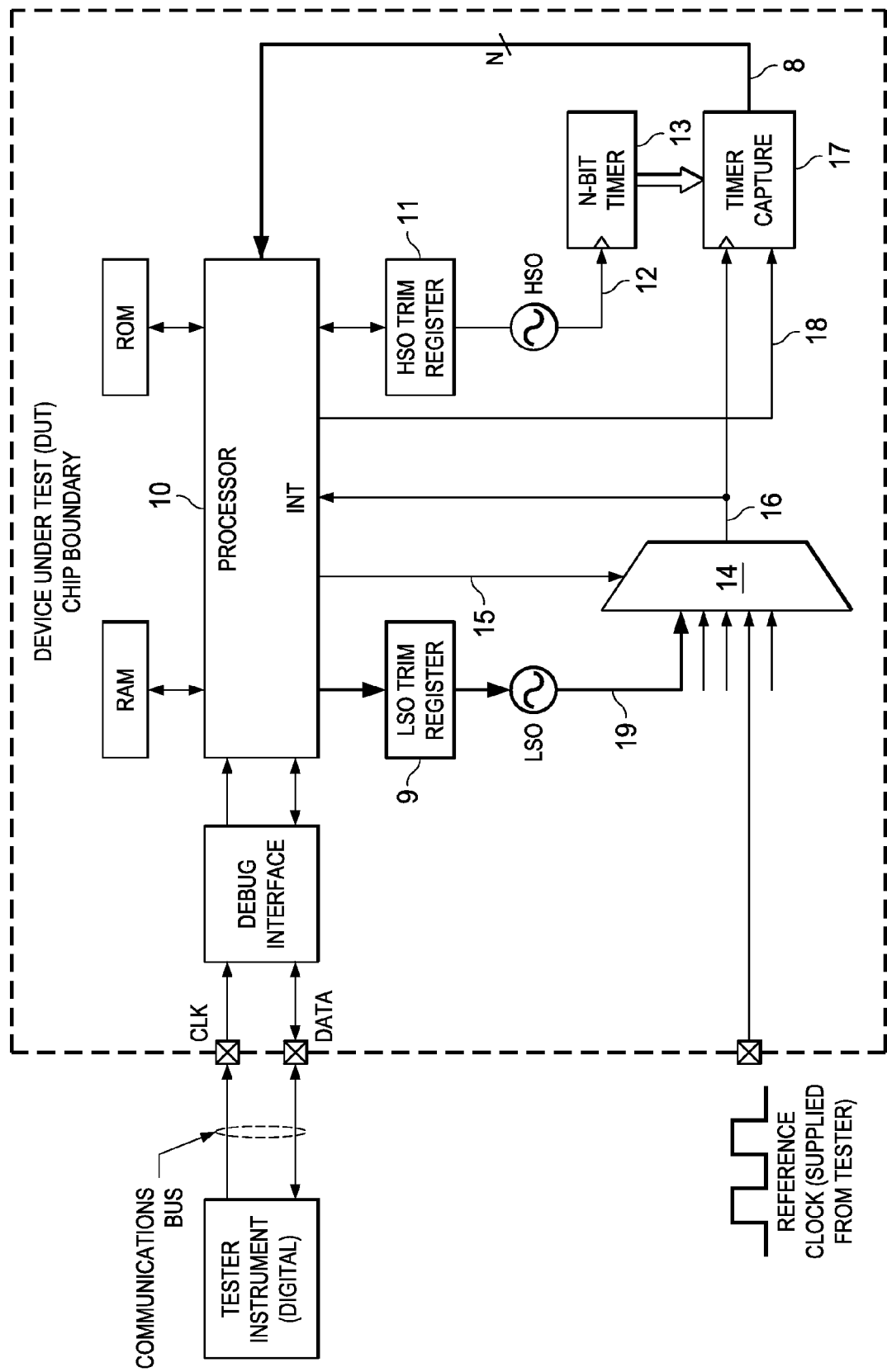
FIG. 1 diagrammatically illustrates apparatus and operations according to example embodiments of the present work.

In example embodiments of the present work, an oscillator trim program (or routine) is stored in read only memory (ROM) on the DUT itself for execution by a processor on the DUT. The external tester supplies parameters for use by this trim program. One of these parameters is indicative of the target oscillation frequency for a high speed oscillator (HSO), for example, a target ratio of the period of the target oscillation frequency to the period of a reference clock having a known frequency. In some embodiments, the target oscillation frequency is 30 MHz and the reference clock frequency is 100 KHz. The trim program then measures the oscillation frequency internally on the DUT. The trim program varies the oscillator trim register value, and selects the trim register value that produces the oscillation frequency closest to the target value. A linear sweep search, successive approximation search, or a combination of both can be used, and the type of search is selectable via parameters passed from the external tester to the trim program.

In order for the trim program to operate autonomously of the tester after it has received parameters from the tester, the trim program needs a way of measuring frequency on the DUT. To this end, a timer (counter) is coupled to the HSO to maintain a running count at the HSO time base (i.e., the timer increments at every rising edge of the HSO). A timer capture register (e.g., a latch) is coupled to the timer and the processor. The timer capture register is controlled by a fixed reference clock such that the count value in the timer is captured (or sampled) into the timer capture register at the instance when an edge of the reference clock occurs. In some embodiments, the tester supplies the reference clock to an externally accessible terminal of the DUT. In some embodiments, the reference clock is generated within the DUT. The trim routine configures the DUT such that the reference clock is routed through a multiplexor to clock the timer capture register.

Each time a rising edge of the reference clock occurs, the current timer count value is latched into the timer capture register. The rising edge of this reference clock also triggers an interrupt to the processor. In response to the interrupt, the trim routine reads the timer capture register and stores the count value temporarily in on-chip RAM. So a count value from the running count is stored in RAM each time a rising edge of the reference clock occurs.

After two or more of the running count values have been captured and stored, the difference between any two consecutively captured count values indicates the number of HSO periods in one reference clock period. That is, the count value difference is the ratio of the HSO period to the reference clock period. The trim routine can thus ultimately choose the HSO trim value that produces a measured ratio closest to the target ratio. After the trim routine has executed, this closest measured ratio may be passed to the tester to inform the tester of the trimmed HSO frequency.

In various embodiments, the trim routine may receive various instructions from the tester. For example, the user (i.e. the tester) can direct the trim routine to do the following (e.g., to improve accuracy in the presence of oscillator jitter): (1) make frequency measurements over more than one reference clock period for a given HSO trim setting; and (2) average the multiple measurements to obtain a final result. The user can also select whether to carry out a successive approximation search, a linear sweep search, or a combination of both, and use the tester to notify the trim routine of the selected search.

Once the HSO has been trimmed to a known frequency, the trim routine can then, based on the known HSO frequency, trim another oscillator in the DUT, such as a lower speed oscillator (LSO) which has an oscillation frequency lower than that of the HSO. In this case, the HSO signal, having a known frequency, effectively serves as a reference clock for use in measuring the LSO frequency. The trim routine reconfigures the DUT so the LSO output is selected by the aforementioned multiplexer to clock the timer capture register. The tester passes to the trim routine an integer value that is a target ratio of the period of the target LSO frequency to the period of the already-trimmed HSO frequency (recall that the period of the HSO relative to the reference clock has already been measured by the trim routine and hence is known by the tester). Using the same process described above for HSO measurement, the trim routine varies the LSO trim value and chooses the LSO trim value that produces an LSO period-to-HSO period ratio closest to the target ratio.

FIG. 1 diagrammatically illustrates apparatus and operations described above according to example embodiments of the present work. The DUT interfaces with an external tester via externally accessible pins as shown. The tester communicates with a data processor 10 in the DUT via a debug interface and a communications bus that carries a clock signal, shown as CLK, and data signaling, shown as DATA. Such interfacing between an on-chip processor and an external tester is conventionally known in the art. In the illustrated example, the tester also provides the reference clock via an externally accessible pin of the DUT.

A trim register 11 is coupled to the HSO and the processor 10. The HSO output 12 (oscillator signal) is coupled to the clock input of an N-bit timer (counter) 13. Although not explicitly shown in FIG. 1, the HSO output 12 is also coupled to a timing architecture that provides timing signals for functional circuitry (e.g., processor 10) of the DUT. A timer capture register 17 (e.g., a latch) has a load input driven by the output 16 of a multiplexer 14 controlled by a signal 15 produced by processor 10. The register 17 is coupled to receive the count value of the timer 13, and to latch that value when clocked at 16. Under control 18 from processor 10, the register 17 makes its contents available to be read by the processor 10 via a bus 8 coupled between the register 17 and the processor 10. The processor 10 uses signal 15 to control multiplexer 14 to route the reference clock from the DUT pin to the multiplexer output 16, as coupled to the load input of register 17. Note that the timer 13 counts periods of the HSO independently of the reference clock and, more generally, independently of the signal at the multiplexer output 16. The multiplexer output 16 is also coupled to the processor 10 to provide an interrupt INT for the trim routine, so that each rising edge of the signal at 16 triggers an interrupt of the trim routine to read the count value on bus 8.

A trim register 9 is coupled to the LSO and the processor 10. The LSO output 19 (oscillator signal) is coupled to an input of the multiplexer 14, so it may be selected by processor 10 to drive the load input of the register 17 during LSO trimming. Although not explicitly shown in FIG. 1, the LSO output 19 is also coupled to a timing architecture that provides timing signals for functional circuitry of the DUT.

In various embodiments, one or more components such as the timer 13, the multiplexer 14 and the timer capture register 17 are already provided as part of the functional circuitry of the DUT, and are thus available for re-use in test mode. In such embodiments, the tester and/or the processor may operate in conjunction with a relatively small amount of added test mode configuration logic to configure the DUT temporarily for re-use of these components in support of the oscillator trimming process.

Figure 2:
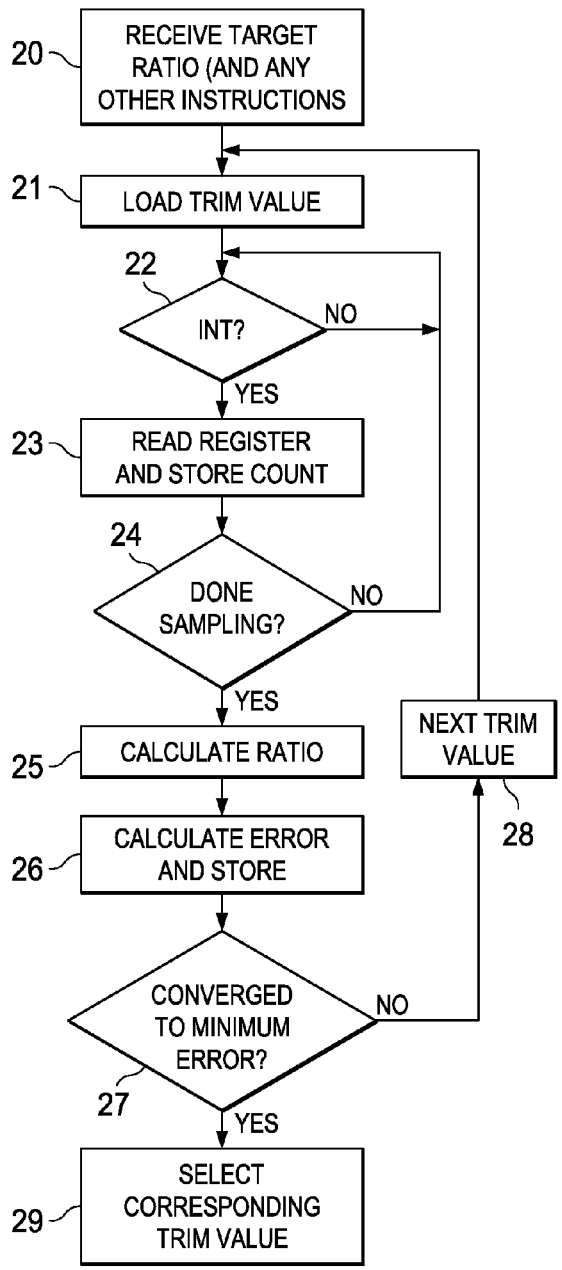
FIG. 2 illustrates operations that can be performed according to example embodiments of the present work.

FIG. 2 illustrates operations described above with respect to execution of the HSO (or LSO) trim routine by processor 10 according to example embodiments of the present work. The operations shown at 21-29 are performed entirely on the DUT. The target period ratio (HSO target period-to-reference clock period, or LSO target period-to-trimmed HSO period) is received at 20 (along with various other instructions in various embodiments). At 21, an initial trim value is loaded from processor 10 into the appropriate trim register. An interrupt INT is then awaited at 22. Upon interrupt at 22, the current count value of the running count is read at 23 from the timer capture register and stored. If count value sampling is not yet complete at 24, the next interrupt is awaited at 22. Otherwise, if count value sampling has been completed, the period ratio associated with the stored count values is calculated at 25. The error between the calculated ratio and the target ratio is calculated and stored at 26 (a running minimum error is also stored, along with its corresponding trim value). At 27, if it is determined that the trimming has converged to a minimum error value, then the trim value corresponding to the minimum error is selected at 29. If trimming has not yet converged to a minimum error value at 27, the next trim value is obtained at 28, and operations return to 21.

Figure 3:
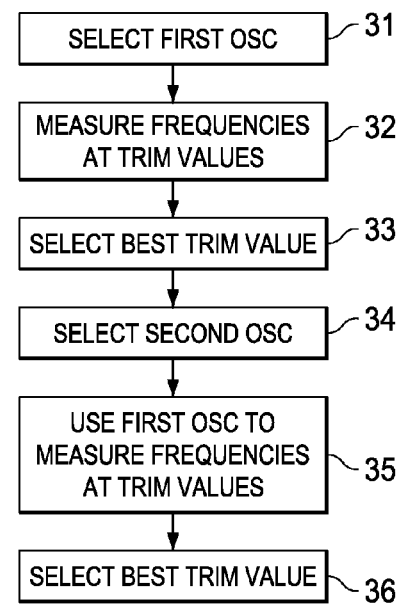
FIG. 3 illustrates operations performed entirely on an IC DUT according to example embodiments of the present work.

FIG. 3 illustrates operations performed entirely on an IC DUT to trim oscillators on the DUT according to example embodiments of the present work. A first oscillator (OSC), e.g., HSO, is selected for trimming at 31. At 32, oscillation frequencies of the first oscillator corresponding to the trim values are measured. At 33, the optimum trim value (that which sets the oscillation frequency as close as possible to the target oscillation frequency for the first oscillator) is selected and loaded into the corresponding trim register. Thereafter, a second oscillator, e.g., LSO, is selected for trimming at 34. At 35, oscillation frequencies of the second oscillator corresponding to the trim values are measured. The first oscillator, e.g., HSO, as controlled by the trim value selected at 33, is used in making the measurements at 35. At 36, the optimum trim value (that which sets the oscillation frequency as close as possible to the target oscillation frequency for the second oscillator) is selected and loaded into the corresponding trim register.

The on-chip oscillator trimming according to the present work is significantly faster than conventional trimming performed almost entirely by test equipment (ATE) external to the DUT. For one example IC having both an HSO and an LSO, the times required to trim the HSO and the LSO are respectively reduced by factors of 15 and 11 as compared to the prior art technique described above.

It will be further noted that the present work frees the external tester to perform other test operations while the oscillator trimming is underway on the DUT, and also permits use of a tester having no oscillator frequency measurement capability, which is typically a less costly tester. Also, because the frequency measurements are made by the DUT itself, and the tester is not required for the frequency measurements, the internal oscillators of numerous DUTs may be trimmed simultaneously in parallel, thus further reducing the required testing time.

Although example embodiments of the present work have been described above in detail, this does not limit the scope of the work, which can be practiced in a variety of embodiments.

What is claimed is:

1. An integrated circuit, comprising:

An oscillator trim register configured to hold oscillator trim values;

a first oscillator coupled to said oscillator trim register and configured to produce a first oscillator signal at an oscillation frequency that depends on the oscillator trim value held in said oscillator trim register; and a logic circuit coupled to said first oscillator and configured to use a reference clock of known frequency to measure the oscillation frequencies respectively corresponding to said oscillator trim values, said logic further configured to count periods of said first oscillator signal utilizing said reference clock for counting periods of said first oscillator signal; and a second oscillator coupled to said oscillator trim register and configured to produce a second oscillator signal at an oscillation frequency that depends on the oscillator trim value held in said oscillator trim register, said second oscillator frequency being a lower frequency than said first oscillator frequency; and repurposing said logic circuit for measuring said second oscillator frequency utilizing said first oscillator signal as said reference clock.

2. The integrated circuit of claim 1, wherein said logic includes a counter coupled to said oscillator and configured to count periods of said oscillator signal.

3. The integrated circuit of claim 2, wherein said logic includes a register coupled to said counter and configured to capture selected count values of said counter.

4. The integrated circuit of claim 3, wherein said register has a load control input driven by said reference clock.

5. The integrated circuit of claim 1, wherein said logic includes a counter configured to count periods of said reference clock.

6. The integrated circuit of claim 5, wherein said logic includes a register coupled to said counter and configured to capture selected count values of said counter.

7. The integrated circuit of claim 6, wherein said register has a load control input driven by said oscillator signal.

8. A method performed entirely within an integrated circuit, comprising:

providing oscillator trim values for each of first and second oscillators;

producing from which the records said first oscillator, for each of said first oscillator trim values, a first oscillator signal at an oscillation frequency that depends on the first oscillator trim value;

measuring the oscillation frequencies of said first oscillator by counting periods of the first oscillator signal between edges of a reference oscillator signal that respectively correspond to said first oscillator trim values;

selecting, based on said measuring, one of said first oscillator trim values to control said first oscillator and trimming said first oscillator to oscillate at said selected trim value;

producing from a second oscillator, for each of said oscillator trim values for the second oscillator, a second oscillator signal at an oscillation frequency that depends on the second oscillator trim value;

using the trimmed first oscillator signal, as controlled by the selected first oscillator trim value, for measuring the oscillation frequencies of said second oscillator that respectively correspond to said second oscillator trim values; and selecting, based on said measuring oscillation frequencies of said second oscillator, one of said oscillator trim values to control said second oscillator, wherein circuitry for measuring oscillator frequency of said first oscillator is repurposed for measuring oscillator frequency of said second oscillator.

9. The method of claim 8, wherein said measuring includes maintaining a count of periods of said first oscillator signal.

10. The method of claim 9, wherein said measuring includes capturing selected count values of said count.

11. The method of claim 10, wherein said capturing includes determining which of said count values are selected for capture based on said reference clock.

12. The method of claim 11, wherein said capturing includes determining which of said count values are selected for capture based on said reference signal.

13. The method of claim 8, wherein said measuring oscillation frequencies of said second oscillator includes maintaining a count of periods of said first oscillator signal.

14. The method of claim 13, wherein said measuring oscillation frequencies of said second oscillator includes capturing selected count values of said count.

15. The method of claim 14, wherein said capturing includes determining which of said count values are selected for capture based on said second oscillator signal.

* * * * *